United States Patent
Kholodenko et al.

(10) Patent No.: US 8,246,755 B2
(45) Date of Patent: Aug. 21, 2012

(54) IN SITU MORPHOLOGICAL CHARACTERIZATION OF FOAM FOR A PROXIMITY HEAD

(75) Inventors: Arnold Kholodenko, San Francisco, CA (US); Gregrory A. Tomasch, Kelseyville, CA (US); Leonid Ginzburg, Santa Clara, CA (US); Cheng-Yu (Sean) Lin, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 420 days.

(21) Appl. No.: 12/613,453

(22) Filed: Nov. 5, 2009

(65) Prior Publication Data
US 2011/0100399 A1 May 5, 2011

(51) Int. Cl.
*B08B 7/00* (2006.01)
*B08B 7/04* (2006.01)

(52) U.S. Cl. .............. 134/18; 134/26; 134/34; 134/902; 134/56 R; 134/58 R; 134/57 R

(58) Field of Classification Search .................... 134/18, 134/26, 34, 902, 56 R, 57 R, 58 R
See application file for complete search history.

(56) References Cited

U.S. PATENT DOCUMENTS

| | | | | |
|---|---|---|---|---|
| 7,913,703 | B1 * | 3/2011 | Farber et al. | 134/184 |
| 2004/0261823 | A1 * | 12/2004 | de Larios | 134/31 |
| 2005/0133060 | A1 * | 6/2005 | Larios et al. | 134/1.3 |
| 2005/0217703 | A1 * | 10/2005 | O'Donnell | 134/21 |
| 2006/0128600 | A1 * | 6/2006 | Freer et al. | 510/491 |
| 2006/0283486 | A1 * | 12/2006 | de Larios et al. | 134/34 |
| 2007/0151584 | A1 * | 7/2007 | Omachi et al. | 134/56 D |
| 2007/0272602 | A1 * | 11/2007 | Czyzewski et al. | 210/89 |
| 2008/0149147 | A1 * | 6/2008 | Wilcoxson et al. | 134/95.2 |
| 2009/0114249 | A1 * | 5/2009 | Mikhaylichenko et al. | 134/21 |
| 2010/0024842 | A1 * | 2/2010 | Kholodenko et al. | 134/2 |
| 2010/0126528 | A1 * | 5/2010 | Kholodenko et al. | 134/21 |

* cited by examiner

*Primary Examiner* — Alexander Markoff
(74) *Attorney, Agent, or Firm* — Martine Penilla Group, LLP

(57) ABSTRACT

In an example embodiment, a wet system delivers a flow of cleaning foam through a channel in a proximity head to a meniscus interfacing with a semiconductor wafer. The wet system diverts a sample of the flow from the channel through a transparent cell that is connected to the channel by an input passage that leads from the channel to the transparent cell and by an output passage that leads from the transparent cell back to the channel. The wet system illuminates the sample in the transparent cell with an LED from the top or the back and captures an image of the illuminated sample with a CCD camera. The image shows a morphological attribute of the cleaning foam such as bubble diameter or spacing. The wet system generates a statistical characterization from the morphological attribute and adjusts other attributes of the cleaning foam based on the statistical characterization.

20 Claims, 14 Drawing Sheets

IN SITU MORPHOLOGICAL CHARACTERIZATION OF FOAM FOR A PROXIMITY HEAD

BACKGROUND

Due to advances in device scaling for semiconductors, semiconductor device features have become smaller at the same time their aspect ratios have become larger. Consequently, semiconductor wafers have become susceptible to damage from wet cleaning and drying. This susceptibility is exacerbated by the use of new materials in the process flows for semiconductor manufacturing.

To address this susceptibility and other problems in the technology for wet cleaning and drying, a system has been developed that uses mechanical and chemical cleaning to selectively remove residue from a semiconductor wafer without damage to the wafer's device structures. This system transports a single semiconductor wafer linearly between an opposing pair of proximity heads that deliver a cleaning fluid to the wafer in an exposure time on the order of a few seconds.

In particular implementations, the cleaning fluid delivered by the opposing proximity heads is a high viscosity, non-Newtonian fluid in the form of a foam generated by mechanically mixing (a) a gas such as nitrogen (N2) and (b) a fluid containing water and a surfactant. See e.g., U.S. Published Patent Application No. 2006/0128600, entitled "Cleaning Compound and Method and System for Using the Cleaning Compound," filed on Feb. 3, 2006, and U.S. application Ser. No. 12/185,780, entitled "Generator for Foam to Clean Substrate," filed on Aug. 4, 2008. The disclosures of these applications are hereby incorporated by reference.

Creating useful metrics for such a foam is difficult. Chemical metrics such as the relative percentages of gas and fluid in the foam are not particularly good (e.g., relevant and/or reliable) measures of how effective the foam is at cleaning particles from the device structures on a semiconductor wafer without damage to the device structures. Consequently, a need exists for a means to statistically characterize the morphology of a foam for cleaning semi-conductor device structures. The embodiments described below include functionality for such statistical characterization, along with additional functionality which is widely applicable to this and other fields.

SUMMARY

In an example embodiment, a wet system includes a proximity head that includes a channel that delivers a flow of cleaning foam to a meniscus interfacing with a semiconductor wafer. The wet system also includes a transparent cell that is connected to the channel by an input passage and an output passage. The input passage diverts a sample of the flow from the channel into the transparent cell and the output passage diverts the sample from the transparent cell back into the channel. Additionally, the wet system includes light emitting diodes that illuminate the sample in the transparent cell from the top and the back, so that a CCD camera can capture a top-lit or a back-lit image of the illuminated sample for statistical characterization and display.

In another example embodiment, a wet system employs a process whose first operation includes delivering a flow of cleaning foam through a channel in a proximity head to a meniscus interfacing with a semiconductor wafer. The wet system diverts a sample of the flow from the channel through a transparent cell that is connected to the channel by an input passage that leads from the channel to the transparent cell and by an output passage that leads from the transparent cell back to the channel. The wet system illuminates the sample in the transparent cell with a light emitting diode from the top or the back and captures an image of the illuminated sample with a CCD camera. The image shows a morphological attribute of the cleaning foam such as bubble diameter or bubble spacing. The wet system then generates a statistical characterization from the morphological attribute and adjusts other (e.g., chemical) attributes of the cleaning foam based at least in part on the statistical characterization. In an example embodiment, the adjustment of the other attributes is accomplished through automation.

The advantages of the present inventions will become apparent from the following detailed description, which taken in conjunction with the accompanying drawings, illustrates by way of example the inventions' principles.

DETAILED DESCRIPTION

In the following description, numerous specific details are set forth in order to provide a thorough understanding of the example embodiments. However, it will be apparent to one skilled in the art that the example embodiments may be practiced without some of these specific details. In other instances, implementation details and process operations have not been described in detail, if already well known.

Figure 1:
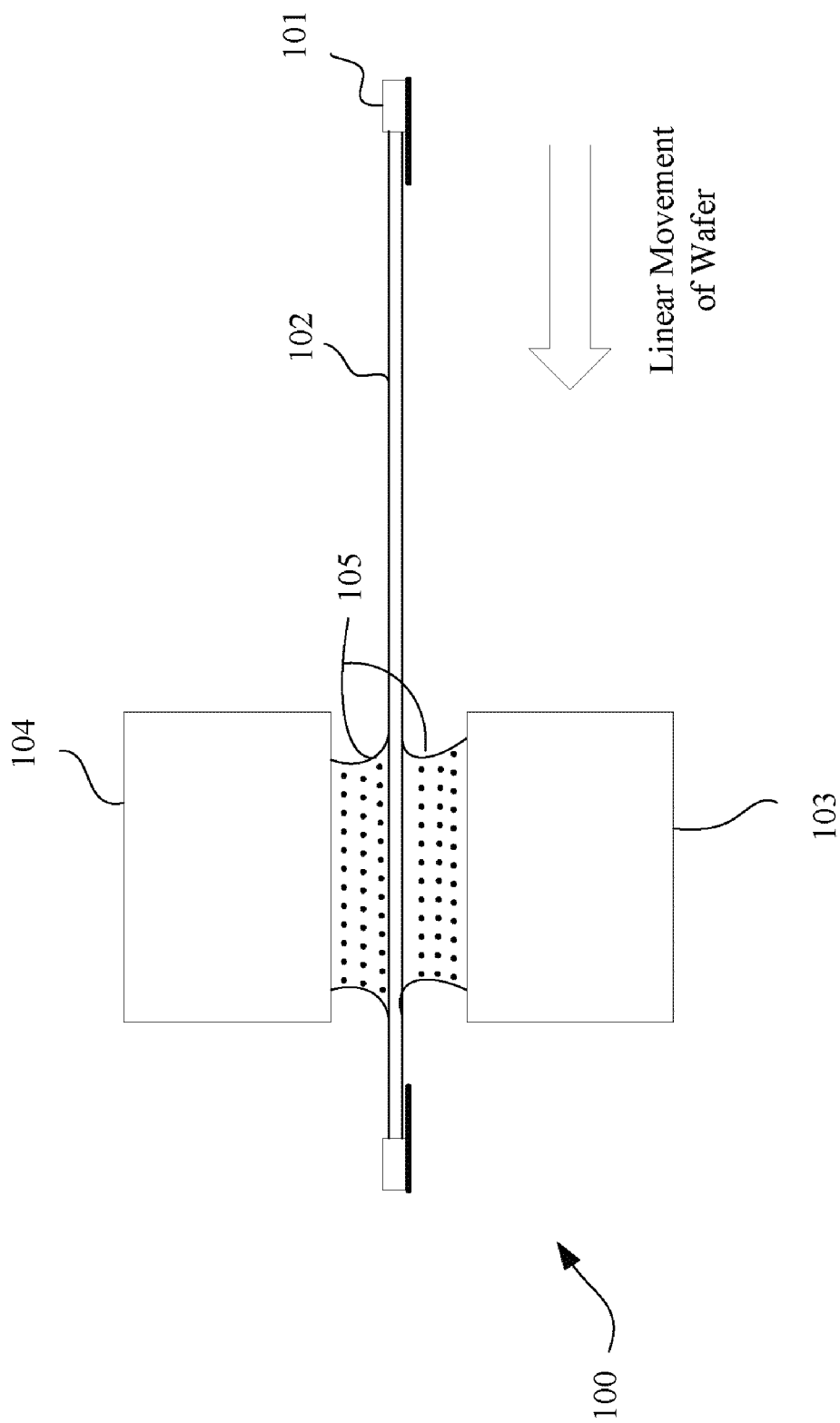
FIG. 1 is a simplified schematic diagram illustrating a linear wet system with a pair of proximity heads for depositing a cleaning foam onto a semiconductor wafer, in accordance with an example embodiment.

FIG. 1 is a simplified schematic diagram of a pair of proximity heads in a linear wet system, in accordance with an example embodiment. In this figure, a linear wet system 100 includes a top proximity head 104 and a bottom proximity head 103. Each of these proximity heads forms a fluid meniscus 105 through which a semiconductor wafer 102 is linearly transported by a carrier 101 with pins on which the semiconductor wafer rests, exposing its surfaces. The meniscus region might cover small or large portions of the surface of semiconductor wafer 102. In this regard, see co-owned U.S. Patent Published Application No. 2008/0081775, entitled "Carrier for Reducing Entrance and/or Exit Marks Left by a Substrate-Processing Meniscus", filed on Sep. 29, 2006, which is incorporated herein by reference.

In an alternative example embodiment, the linear wet system 100 might have only a top proximity head 104 or only a bottom proximity head 103, rather than a pair of proximity heads. Also, in an alternative example embodiment, the wet system might be a rotational or spinning wet system rather than a linear wet system.

In an example embodiment, the fluid is a foam created by mechanically mixing a gas (such as nitrogen) and a fluid (an aqueous solution with a surfactant) in the generator described in U.S. application Ser. No. 12/185,780, incorporated by reference above. As explained in that application, the term "P2" refers to the two phases of matter that are present in the fluid input to the generator, e.g., liquid water and solid surfactant. The term "P3" refers to the three phases of matter that are present in the foam output by the generator, e.g., liquid water, solid surfactant, and gaseous nitrogen (N2). In an example embodiment, P3 is a high viscosity (in the range of 200-2000 cP or centipoise), non-Newtonian fluid. The hydraulic properties of P3 are fundamentally different from a regular Newtonian fluid, such as water. P3 can be generalized as a pseudo-plastic material where the fluid viscosity decreases with increasing shear rate (e.g., it is "shear-thinning"). In an example embodiment, the solid surfactant might be stearic acid, though other fatty acids can be used as alternatives as explained in U.S. Published Patent Application No. 2006/0128600, incorporated by reference above. Those other fatty acids include lauric, palmitic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, and clupanodonic acid, either alone or in combination with themselves or with stearic acid.

Figure 2:
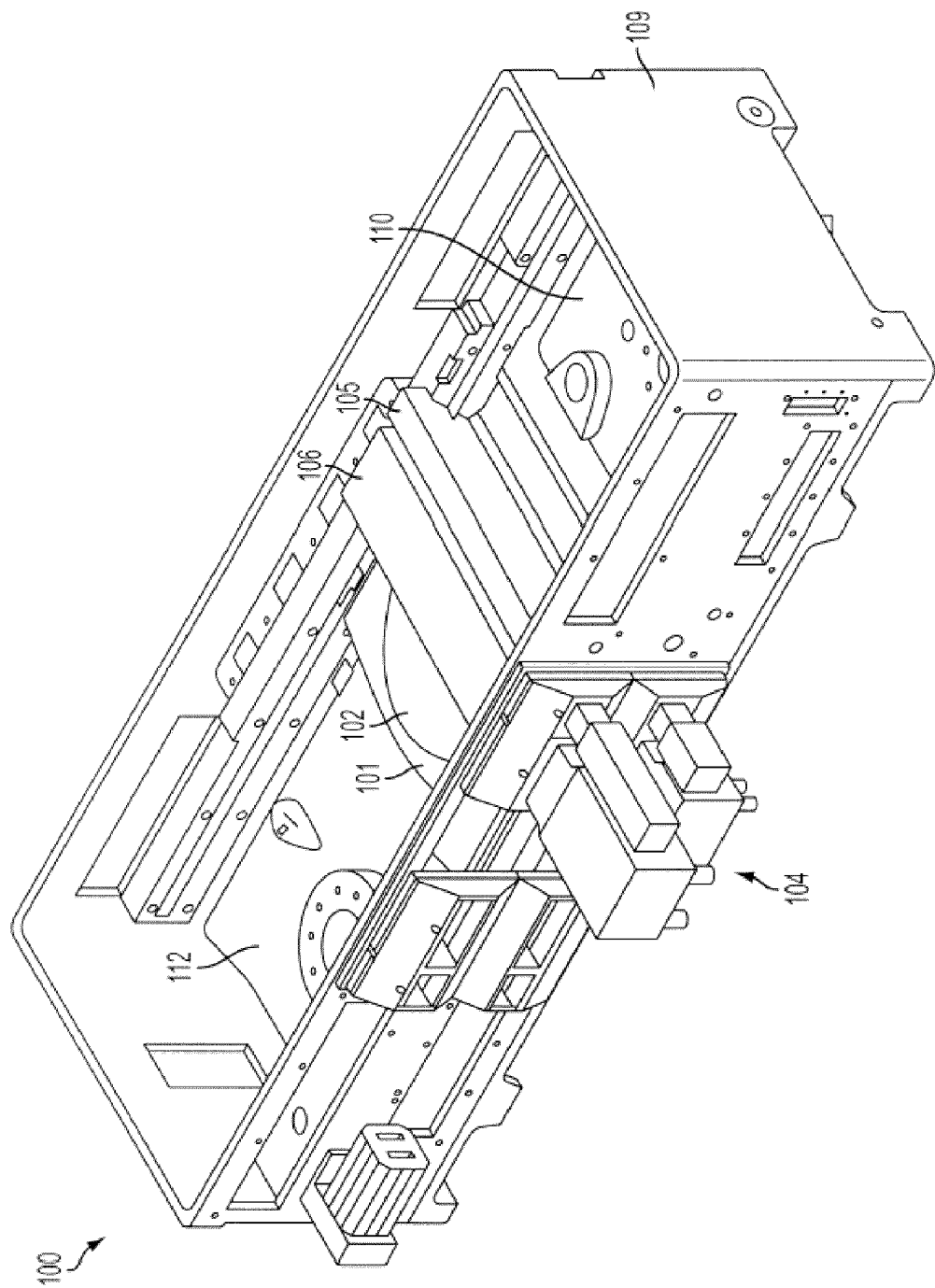
FIG. 2 is a diagram illustrating a perspective view of a process chamber in a linear wet system, in accordance with an example embodiment.

FIG. 2 is a diagram illustrating a perspective view of a process chamber in a linear wet system, in accordance with an example embodiment. As depicted in FIG. 2, a linear wet system 100 includes a process chamber 109 in which a carrier 101 transports a semiconductor wafer 102 from an input module 110 to an output module 112. During transport, the wafer 102 passes beneath a top proximity head 104, which in turn include a top cleaning head 106 and an optional top conditioning head 105.

Figure 3:
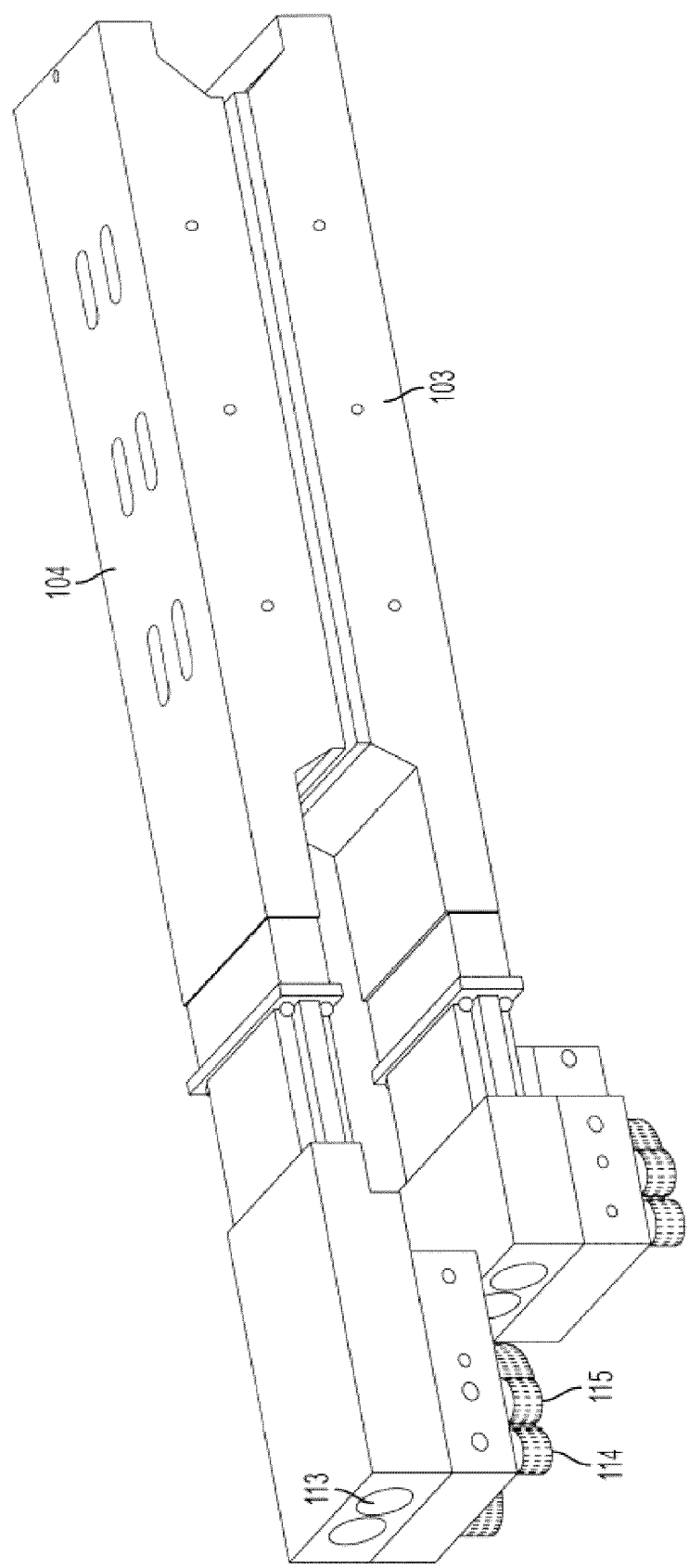
FIG. 3 is a diagram illustrating a perspective view of a pair of proximity heads in a linear wet system, in accordance with an example embodiment.

FIG. 3 is a diagram illustrating a perspective view of a pair of proximity heads in a linear wet system, in accordance with an example embodiment. Both the top proximity head 104 and the bottom proximity head 103 are shown in this figure. In an example embodiment, the top proximity head includes a P3 generator 113, as described in greater detail in U.S. application Ser. No. 12/185,780, incorporated by reference above. In an example embodiment, the P3 generator 113 might receive P2 through the input 114 and a gas (e.g., N2) through the input 115 and produce P3 by mixing them in a sealed helical channel which is not shown.

Figure 4:
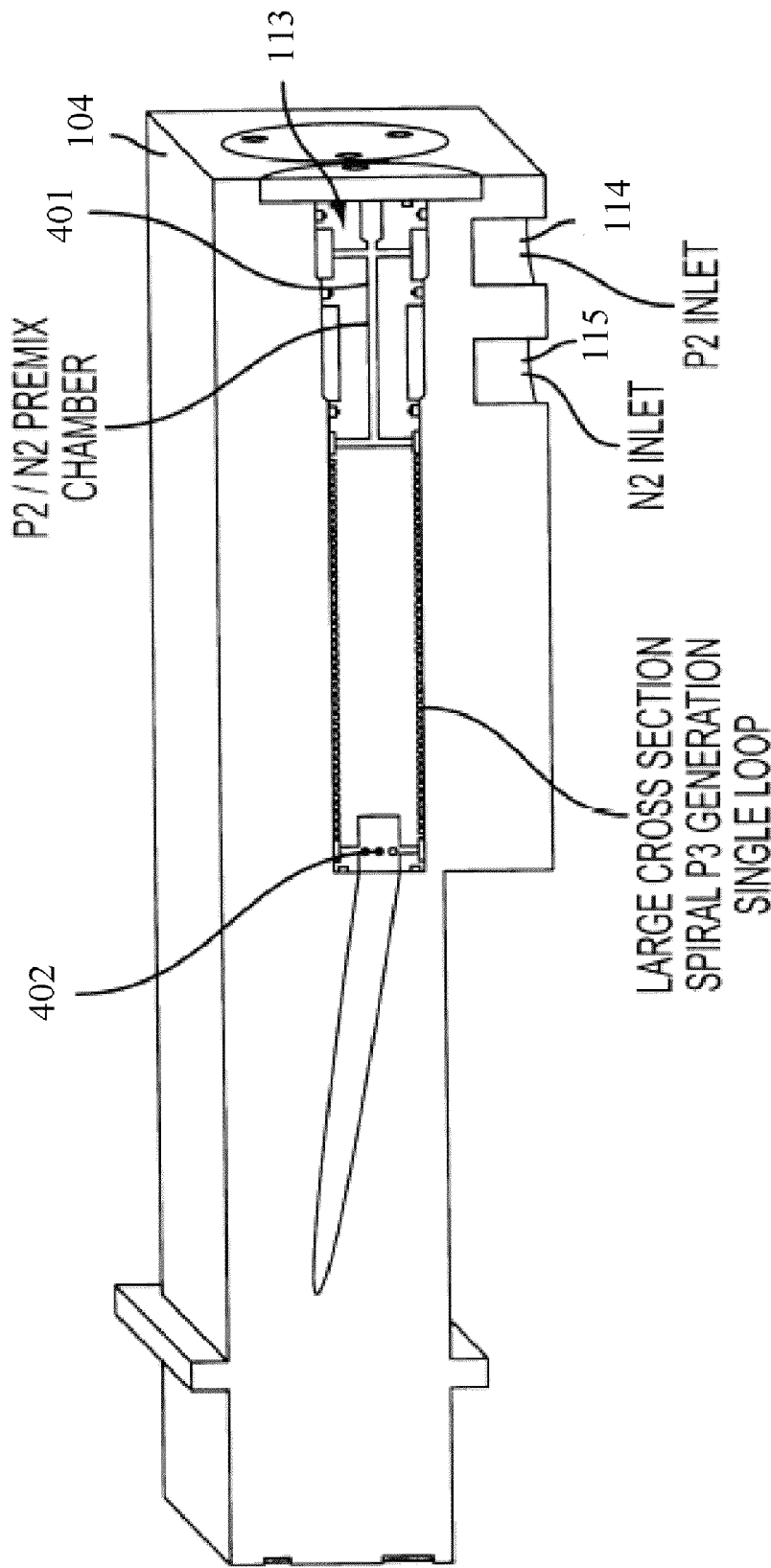
FIG. 4 is a diagram illustrating a cross-sectional view of a male plug and female housing for a foam generator for a proximity head in a linear wet system, in accordance with an example embodiment.

FIG. 4 is a diagram illustrating a cross-sectional view of a male plug and female housing for a foam generator for a proximity head in a linear wet system, in accordance with an example embodiment. In FIG. 4, the male plug 113 fits tightly into female housing 104, from which the male plug 113 can be readily removed for cleaning (e.g., with deionized water) or other maintenance. FIG. 4 shows a premix chamber 401 with an inlet 114 for P2 and an inlet 115 for N2. FIG. 4 also shows the aperture 402 through which the cleaning foam (e.g., P3) flows toward the proximity head which will be used to deposit the P3 on a substrate (e.g., a semiconductor wafer).

In an example embodiment, the male plug might be made from a highly nonreactive thermoplastic such as polyvinylidene chloride (PVDF) or KYNAR (also called HYLAR or SYGEF). In other alternative example embodiments, the plug might be made of ethylene chlorotrifluoroethlyene (ECTFE) or halar. It will be appreciated that it might be beneficial to match the material used to make the male plug with the material used to make the female housing (e.g., the male plug and the female housing would then have the same coefficient of thermal expansion) and the adjoining proximity head. That is to say, in an example embodiment, the proximity head and its components might be made from a highly nonreactive thermoplastic such as PVDF or ECTFE.

Figure 5:
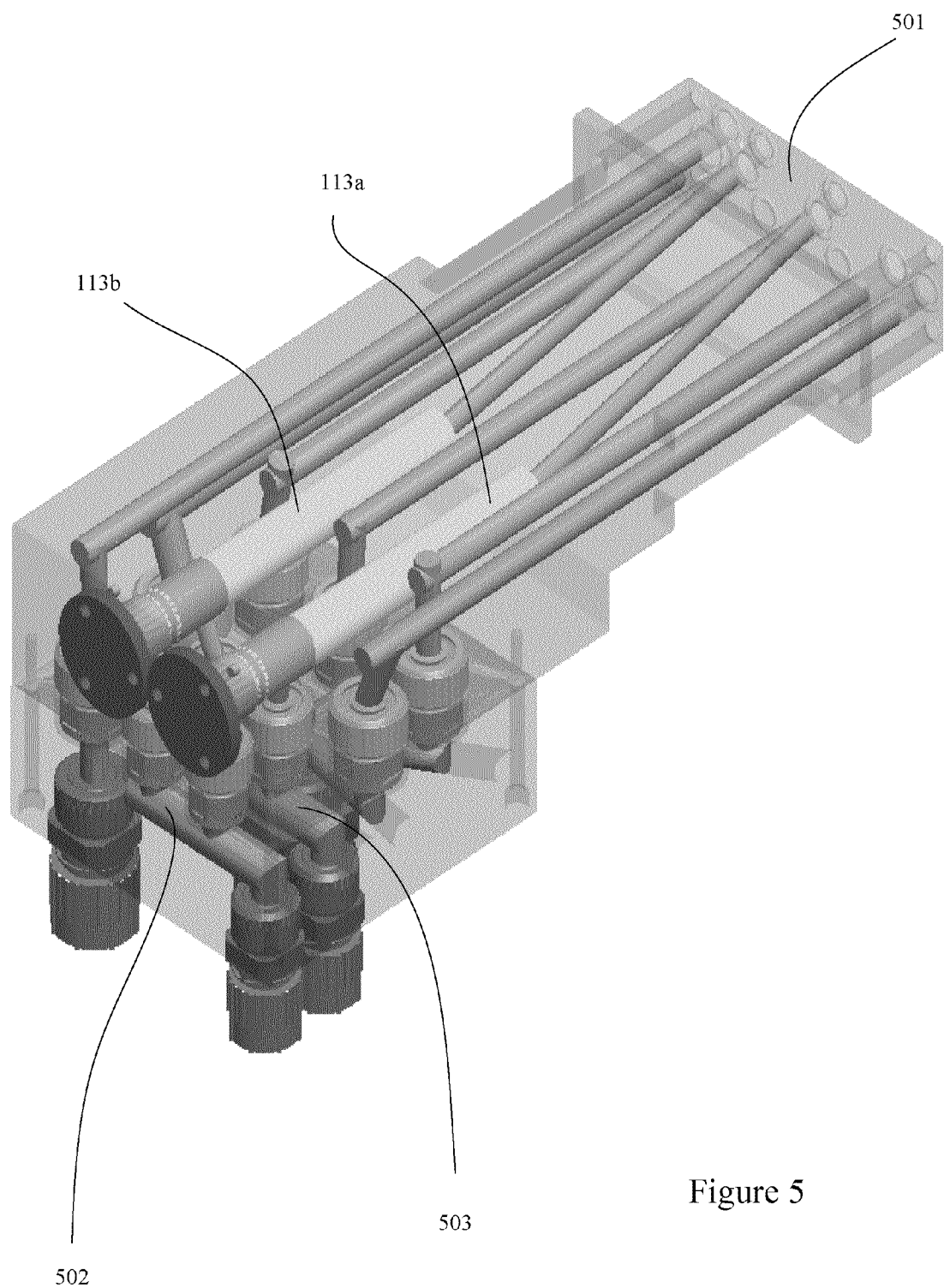
FIG. 5 is a diagram illustrating a transparent view of a male plug and female housing for a foam generator for a proximity head in a linear wet system, in accordance with an example embodiment.

FIG. 5 is a diagram illustrating a transparent view of a male plug and female housing for a foam generator for a proximity head in a linear wet system, in accordance with an example embodiment. In FIG. 5, manifold 501 includes two male plugs 113a and 113b which provide cleaning foam (e.g., P3) to a proximity head which is to the upper right outside of FIG. 5. FIG. 5 also shows the transmission pipe 502 for the P2 fluid and the transmission pipe 503 for the N2 for the male plugs 113a and 113b. It will be appreciated that this transparent view does not show the female housings for the male plugs 113a and 113b, for purposes of exposition. However, the arrangement of components in FIG. 5 is similar to the arrangement of components in FIG. 4. It will also be appreciated that the cleaning foam (e.g., P3) created by male plug 113a might differ from the cleaning foam (e.g., P3) created by male plug 113b, in order to provide flexibility with respect to foam deposition, as explained in greater detail in co-owned U.S. patent application Ser. No. 12/324,316, entitled "Confinement of Foam Delivered by a Proximity Head," which was filed on Nov. 26, 2008, and which is incorporated herein by reference.

Figure 6:
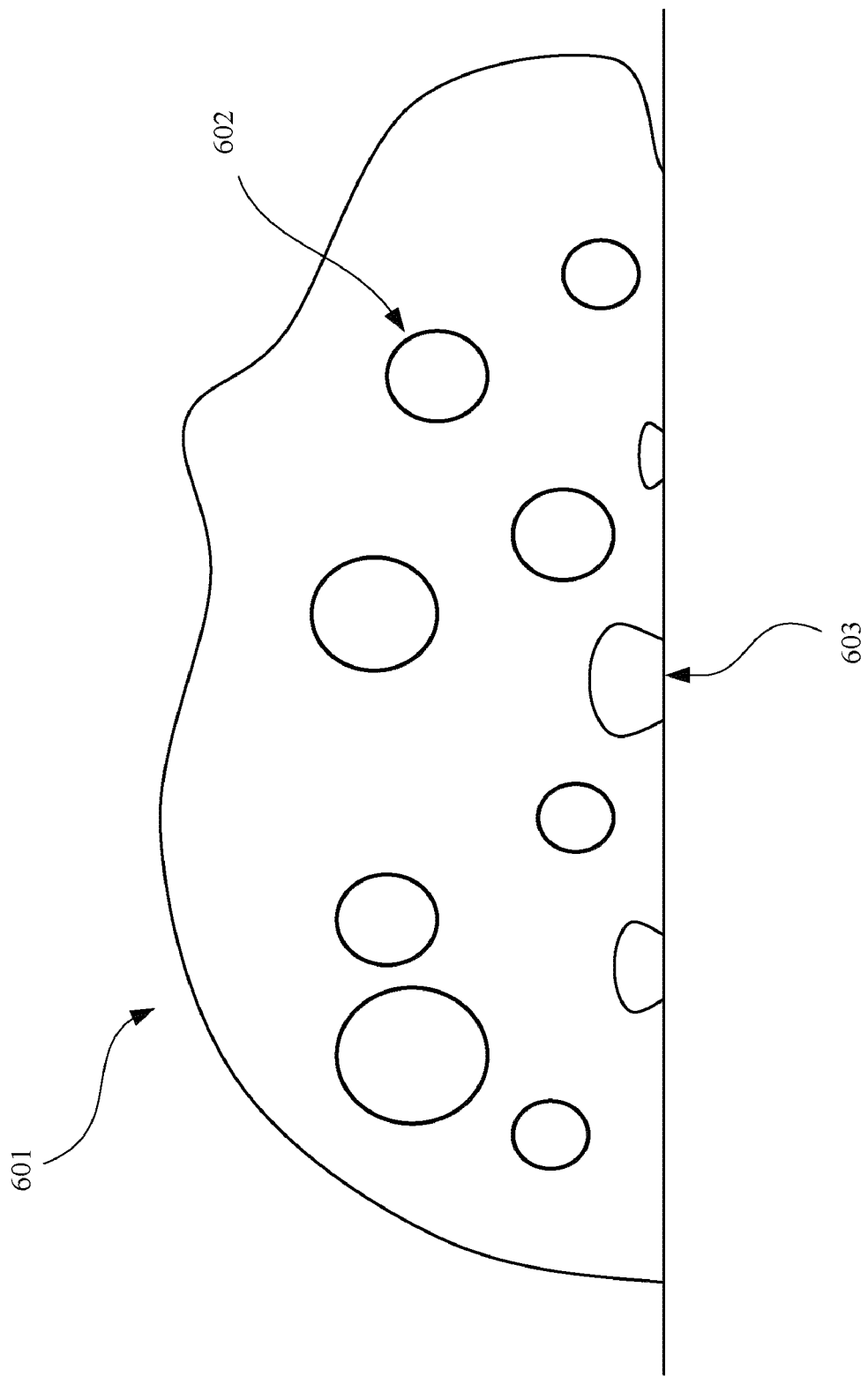
FIG. 6 is a schematic diagram illustrating bulk and surface bubbles in a cleaning foam produced by a foam generator, in accordance with an example embodiment.

FIG. 6 is a schematic diagram illustrating bulk and surface bubbles in a cleaning foam produced by a foam generator, in accordance with an example embodiment. As shown in this diagram, cleaning foam 601 (e.g., P3) includes both bulk bubbles 602 and surface bubbles 603. Obviously, the former type of bubbles differ from the later type of bubbles with respect to location, "surface bubbles" by definition are on the surface or boundary of the foam, e.g., where the foam interfaces with another substance such as air or a solid such as nonreactive thermoplastic or quartz. As will be explained in further detail below, the system captures images of bulk bubbles 602 in the foam 601 through back lighting and captures images of surface bubbles 603 in the foam 601 through top lighting.

Figure 7:
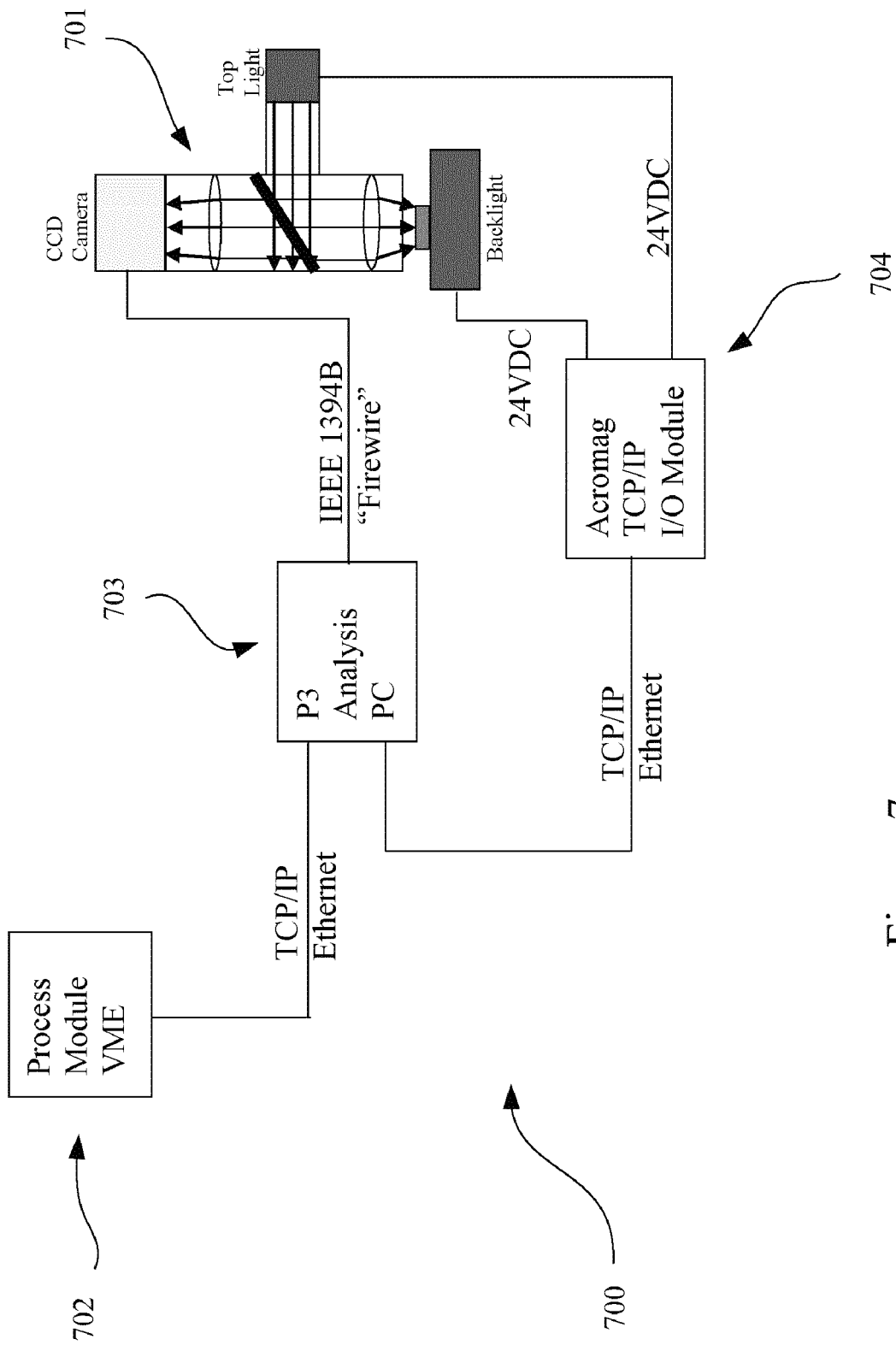
FIG. 7 is a schematic diagram illustrating the connections (e.g., data and electronic) in a system for capturing photographic images of bulk and surface bubbles in a foam produced by a foam generator, in accordance with an example embodiment.

FIG. 7 is a schematic diagram illustrating the connections (e.g., data and electronic) in a system for capturing photographic images of bulk and surface bubbles in a foam produced by a foam generator, in accordance with an example embodiment. As depicted in FIG. 7, the system 700 includes a subsystem 701 which is described in further detail below. The CCD camera of subsystem 701 is connected by an IEEE 1349B (e.g., FireWire) interface to a personal computer (PC) 703 which performs P3 analysis. The PC 703 is also connected by respective TCP/IP Ethernet LANs to: (a) an Acromag® I/O module 704, which in turn is connected to the top light and the backlight of subsystem 701 (e.g., by 24 volt DC excitation supplies); and (b) a process-module VME controller 702 composed of a computer system that controls a process chamber through the use of sensors connected to a VME-bus, as described in co-owned U.S. Pat. No. 7,356,580, which is hereby incorporated by reference. It will be appreciated that the process chamber is where P3 foam is applied to a semiconductor wafer by a proximity head; that is to say, the P3 flows from a P3 generator into the proximity head in the process chamber. FIG. 2 depicts a process chamber 109.

In an example embodiment, the PC 703 includes software to perform the following functions: (1) coordinate image capture by the CCD camera with lighting which is activated by the Acromag® I/O module 704 and which toggles between top lighting and back lighting at a specific frequency per unit of time (e.g., 1 cycle per second or 1 Hz) when in automatic operational mode; (2) vision analysis of the captured images (e.g., measurement of bulk bubble diameter, bulk bubble spacing, surface bubble diameter, surface bubble spacing, etc.); and (3) data coordination with the process-module VME controller 702. In an example embodiment, the PC's data coordination with the process-module VME controller 702 might include (a) data acquisition from the process-module VME controller and (b) statistical summary transfer to the process-module VME controller, where the statistical summary might be used to determine further process steps such as ceasing further processing of semiconductor wafers in the process chamber if the P3 foam is not satisfactory in terms of bulk bubble diameter, bulk bubble spacing, surface bubble diameter, surface bubble spacing, etc. In an example embodiment, some of these functions (e.g., vision analysis) might be performed fully or partially by software (including third-party software such as Cognex® Vision Pro®) and/or by firmware/hardware.

Figure 8:
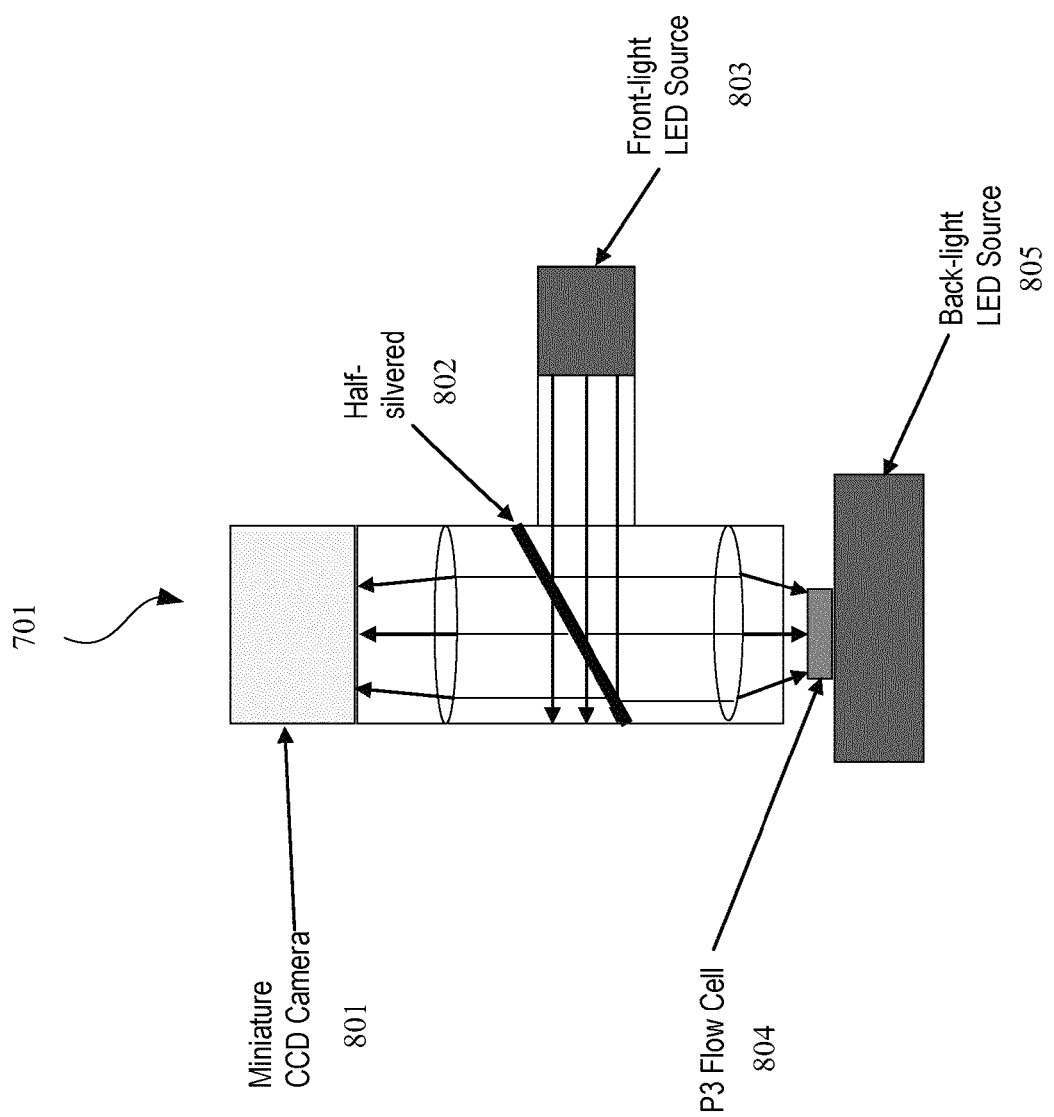
FIG. 8 is a schematic diagram illustrating a subsystem for capturing photographic images of bulk and surface bubbles in a foam produced by a foam generator, in accordance with an example embodiment.

FIG. 8 is a schematic diagram illustrating a subsystem for capturing photographic images of bulk and surface bubbles in a foam produced by a foam generator, in accordance with an example embodiment. As depicted in this figure, a subsystem 701 includes a miniature charge-coupled device (CCD) camera 801 (e.g., the Point Grey Research Chameleon™ USB 2.0 digital video camera with a Sony ICX445 EXview HAD CCD® sensor) which captures images of a P3 foam as it flows through a transparent flow cell 804. In an alternative example embodiment, the CCD camera 801 might be replaced by a camera with an active pixel sensor (APS) or complementary-metal-oxide-semiconductor (CMOS) sensor. That is to say, the CCD camera 801 might be replaced by a camera with another suitable image sensor. Though not depicted in FIG. 8, the CCD camera 801 might be affixed to a borescope or other similar optical device.

In an example embodiment, the P3 flow cell 804 might be made of quartz, though any other relatively transparent and relatively inert material might be substituted. Also, as depicted in this figure, the subsystem 701 can light the P3 foam flowing through the flow cell 804 from either the top (or front) and the back. To light the P3 foam from the top (or front), the subsystem 701 employs a light-emitting diode (LED) source 803 orthogonal to an axis running from the CCD camera 801 to the flow cell 804 and a "half-silvered" mirror 802. It will be appreciated that the "half-silvered" mirror 802 reflects the light from the LED source 803 onto the flow cell 804, while at the same time allowing the CCD camera 801 to capture an image of the flow cell 804.

To light the P3 foam from the back, the subsystem 701 employs an LED source 805 located underneath the flow cell 804. In an example embodiment, the subsystem 701 might alternately (a) light LED source 803 and capture a top-lit image of surface bubbles in the P3 foam and (b) light LED source 805 and a capture a back-lit image of bulk bubbles in the P3 foam, using the CCD camera 801, as described earlier.

Figure 9:
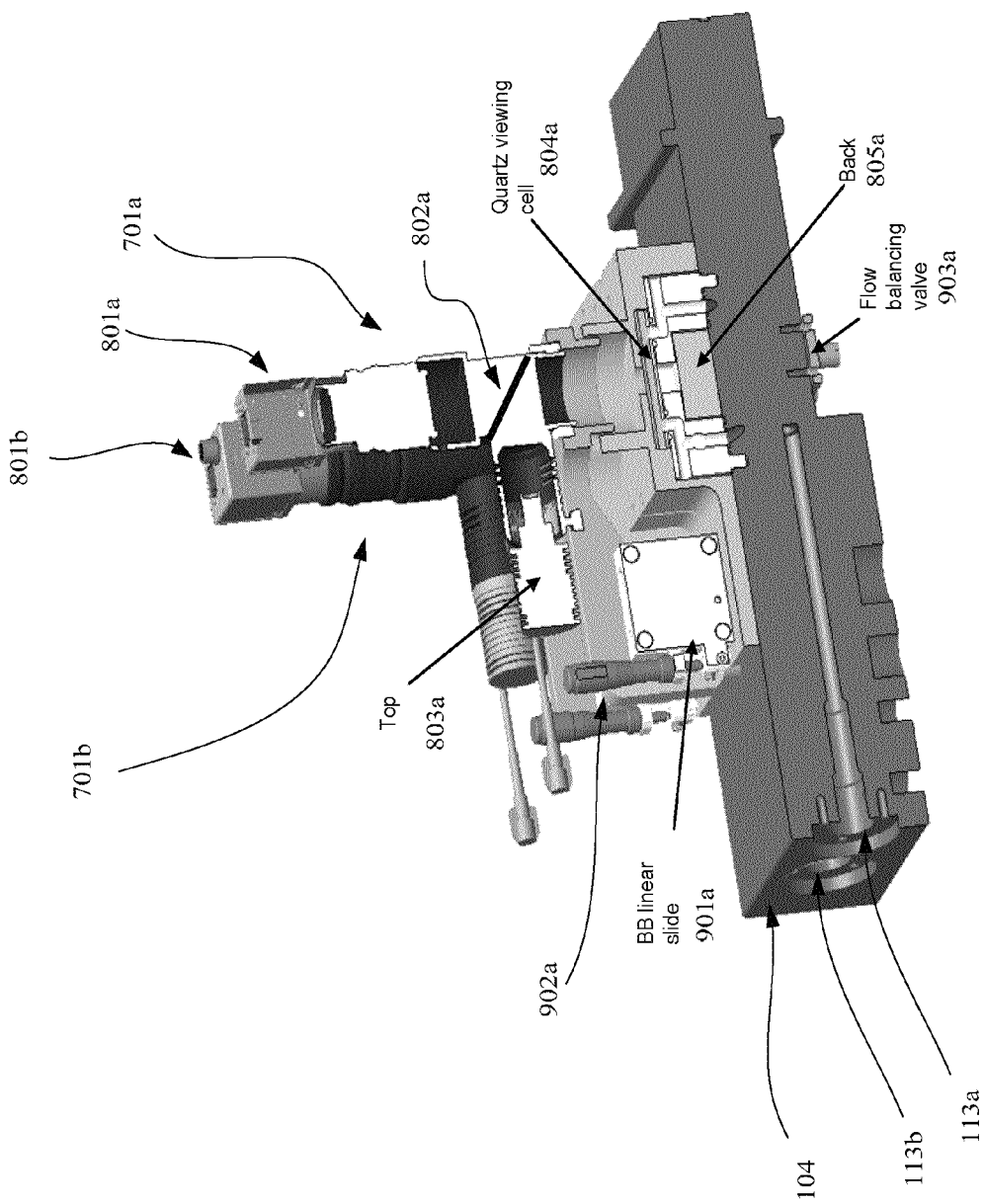
FIG. 9 is a diagram illustrating a foam generator and a system for capturing photographic images of bulk and surface bubbles in a generated foam, in accordance with an example embodiment.

FIG. 9 is a diagram illustrating a pair of foam generators and subsystems for capturing photographic images of bulk and surface bubbles in a generated foam, in accordance with an example embodiment. As depicted in this figure, a proximity head 104 includes two male plugs 113a and 113b (see FIG. 5 above), each of which is connected to a respective subsystem, 701a and 701b. Subsystem 701a is shown in cross-sectional view; subsystem 701b is shown behind subsystem 701a. Subsystem 701a includes CCD camera 801a, which is also shown in cross-sectional view. Subsystem 701b includes CCD camera 801b. Subsection 701a also includes cross-sectional views of (a) LED source 803a, which might be used in conjunction with mirror 802a (shown in cross-sectional view) to light the P3 foam in flow cell 804a (shown in a cross-sectional view) from the top, and (b) LED source 805a (shown in a cross-sectional view), which might be used to the light the P3 foam in flow cell 804a from the back.

Also as depicted in FIG. 9, subsystem 701a includes ball-bearing linear slide 901a (shown in cross-sectional view) controlled by a focus control 902a, which can be used to move CCD camera 801a up and down, to facilitate focusing of the CCD camera 801a on the flow cell 804a. It will be appreciated that in an alternative example embodiment, another suitable focusing device might be substituted. Additionally, subsystem 701a includes a flow-balancing valve 903a (also shown in cross-sectional view) which might be used to increase or decrease the flow of P3 foam coming from male plug 113a, e.g., to achieve a flow that facilitates image capture by CCD camera 801a without significantly impacting the delivery of P3 foam by the proximity head 104.

Figure 10:
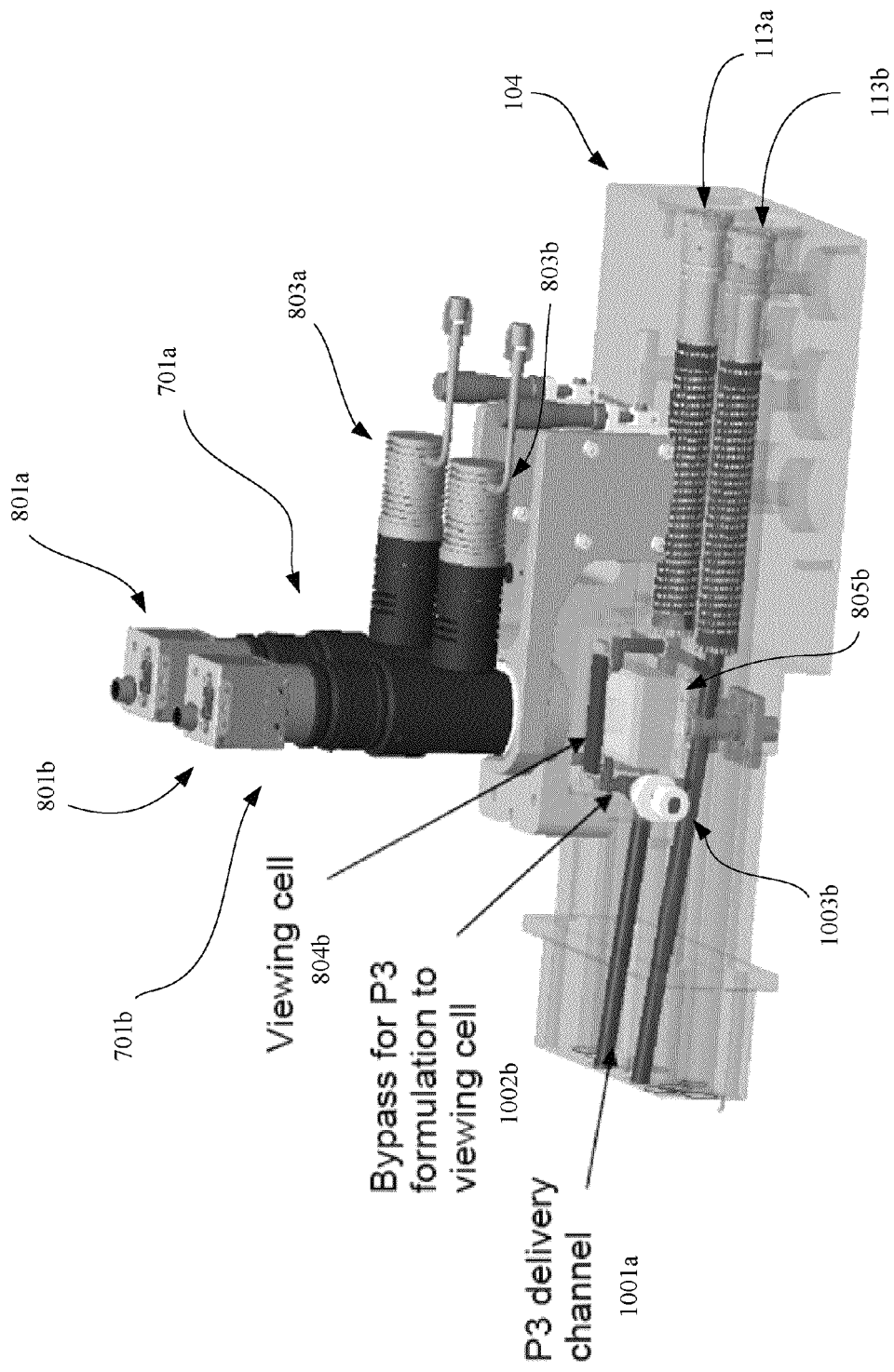
FIG. 10 is a diagram illustrating a partially transparent view of a foam generator and a system for capturing photographic images of bulk and surface bubbles in a generated foam, in accordance with an example embodiment.

FIG. 10 is a diagram illustrating a partially transparent view of a pair of foam generators and subsystems for capturing photographic images of bulk and surface bubbles in a generated foam, in accordance with an example embodiment. It will be appreciated that this figure shows many of the items depicted in FIG. 9, albeit from another perspective and with a transparent proximity head. As depicted in this figure, a proximity head 104 again includes two male plugs 113a and 113b, each of which is connected to a respective subsystem, 701a and 701b. Subsystem 701a includes CCD camera 801a and LED source 803a which might be used to light the P3 foam in flow cell 804b from the top, while subsystem 701b includes CCD camera 801b and LED source 803b. Also depicted in FIG. 10 is LED source 805*b*, which might be used to the light the P3 foam in flow cell 804*b* from the back.

As depicted in FIG. 10, subsystem 701*b* includes a bypass 1002*b* for P3 foam which is controlled by a valve 1003*b*, e.g., opening the valve 1003*b* allows P3 foam to flow through the bypass 1002*b*, while closing the valve 1003*b* cuts off that flow. The transparent proximity head 101 also includes P3 delivery channel 1001*a*, which transports P3 foam to the proximity head's surface that interfaces with a meniscus, as described above.

Figure 11:
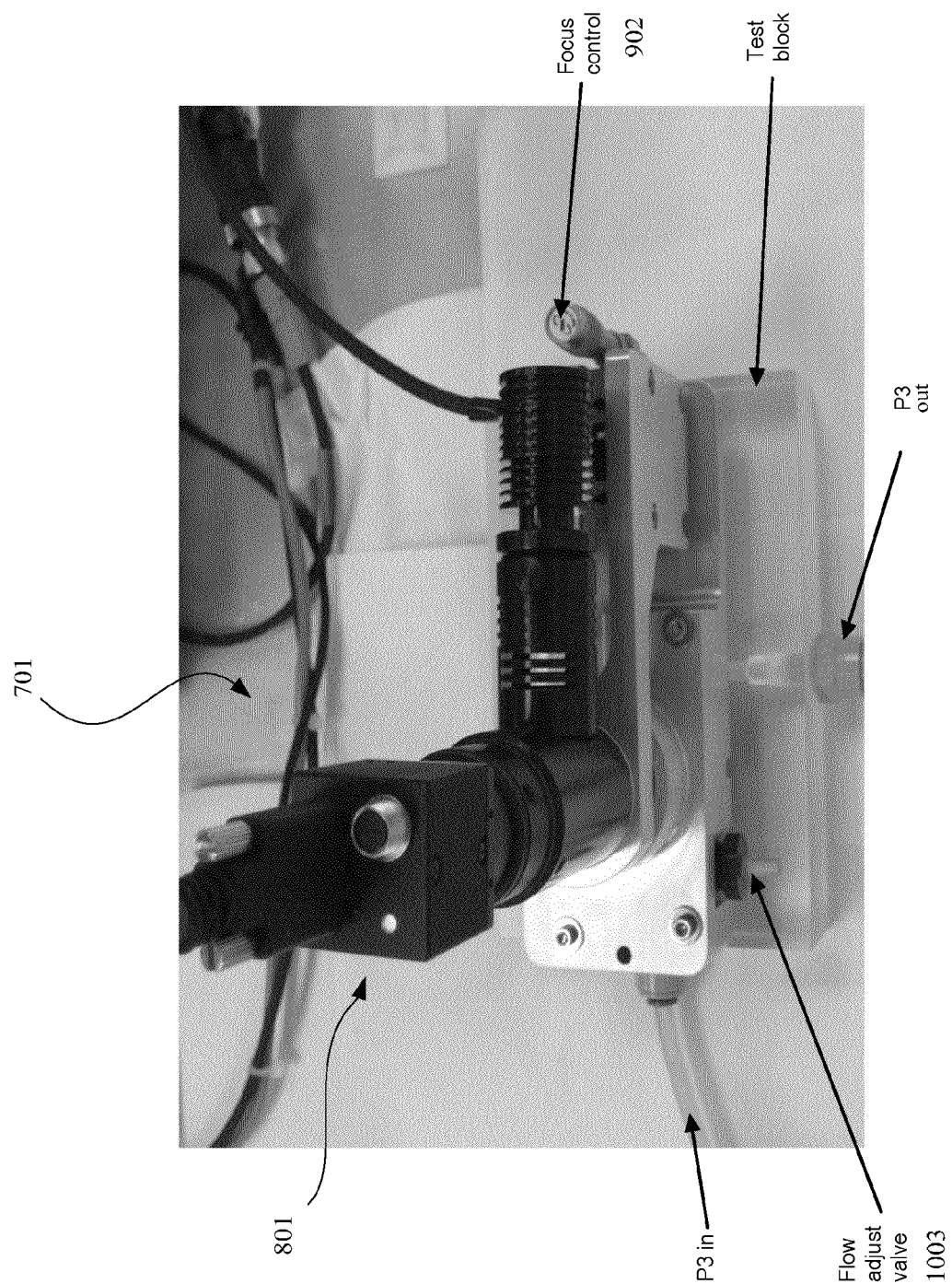
FIG. 11 is a diagram showing a top view of a subsystem for capturing photographic images of bulk and surface bubbles in the generated foam, in accordance with an example embodiment.

FIG. 11 is a diagram showing a top view of a subsystem for capturing photographic images of bulk and surface bubbles in a generated foam, in accordance with an example embodiment. As depicted in this figure, a subsystem 701 includes a CCD camera 801 whose focus can be adjusted with focus control 902. The figure also shows a valve 1003 which can be used to adjust the flow of the P3 through the flow cell, in order to facilitate image capture by CCD camera 801. It will be appreciated that the system 701 in FIG. 11 is not attached to a proximity head. That is to say, the figure depicts an experimental setup.

Figure 12:
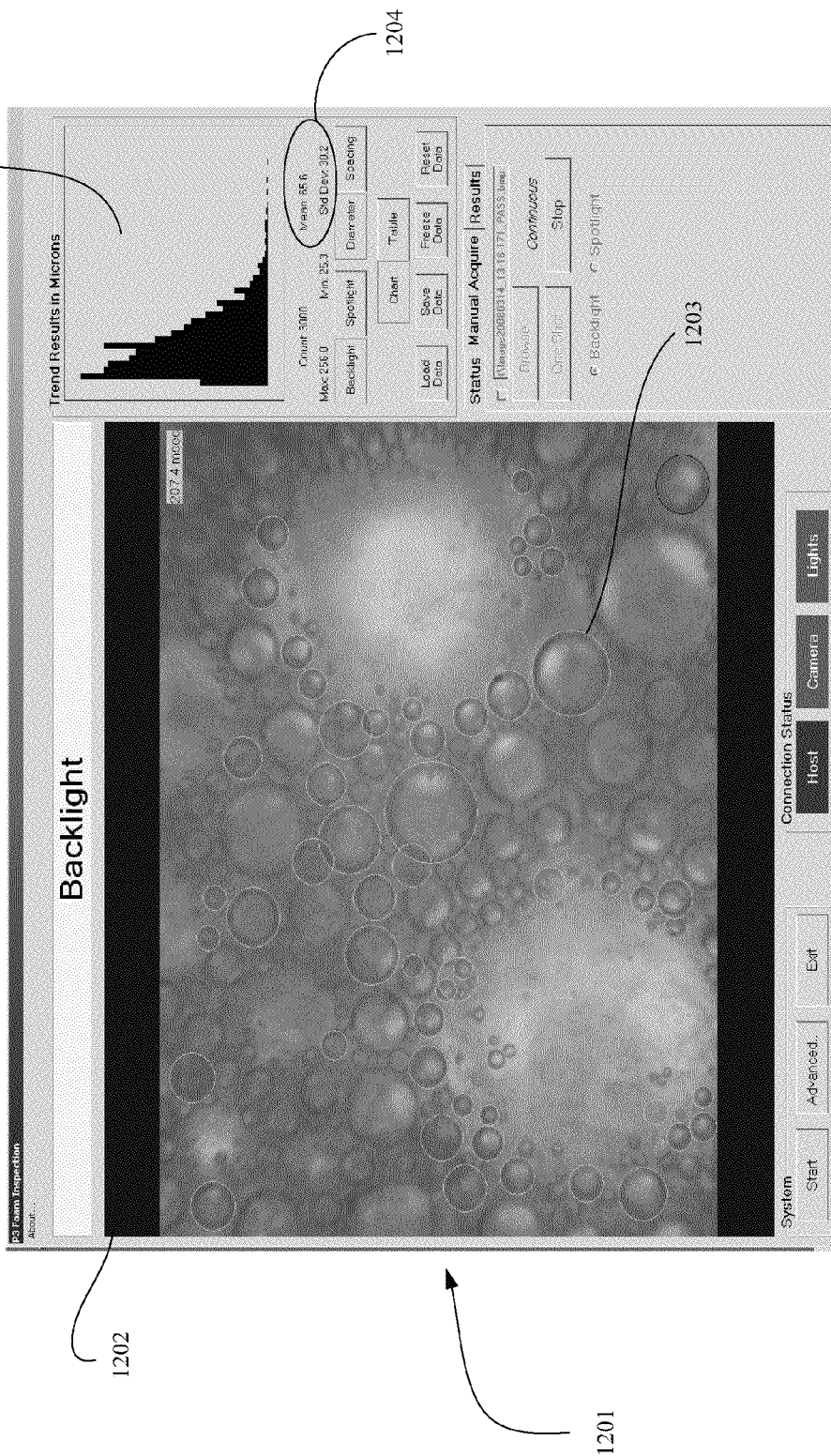
FIG. 12 is a graphical user interface (GUI) view showing the bulk bubbles in a foam generated by a foam generator and related statistics, in accordance with an example embodiment.

FIG. 12 is a GUI view showing the bulk bubbles in a foam generated by a foam generator and related statistics, in accordance with an example embodiment. In an example embodiment, the GUI view 1201 might be displayed on a computer peripheral such as a monitor by PC 703 in FIG. 7. The GUI view includes an image 1202 of the cleaning foam. The image 1202 includes bulk bubbles such as bulk bubble 1203 that are visible in the flow cell when it is lit from the back by an LED source (e.g., a backlight). The GUI view 1201 also includes a histogram 1205 and statistics 1204 resulting from analysis of the image 1202. The statistics 1204 include a mean diameter of 65.6 microns with a standard deviation of 30.2 microns, as well as maximum diameter of 256.0 microns and a minimum diameter of 25.3 microns. Here it will be appreciated that the button labeled "Diameter" appears relatively depressed compared to the "Spacing" button in GUI view 1201. The GUI view 1201 also includes a button which allows for manual acquisition of an image and subsequent analysis.

In an example embodiment, histogram 1205 and the statistics 1204 might be generated by PC software that measures diameter or spacing of the bulk bubbles such as bulk bubble 1203 in image 1202. In an alternative example embodiment, other bulk bubble attributes (e.g., radius, circumference, etc.) might be measured by the PC software and serve as a basis for a histogram and/or statistics to be displayed in a GUI view similar to GUI view 1201.

Figure 13:
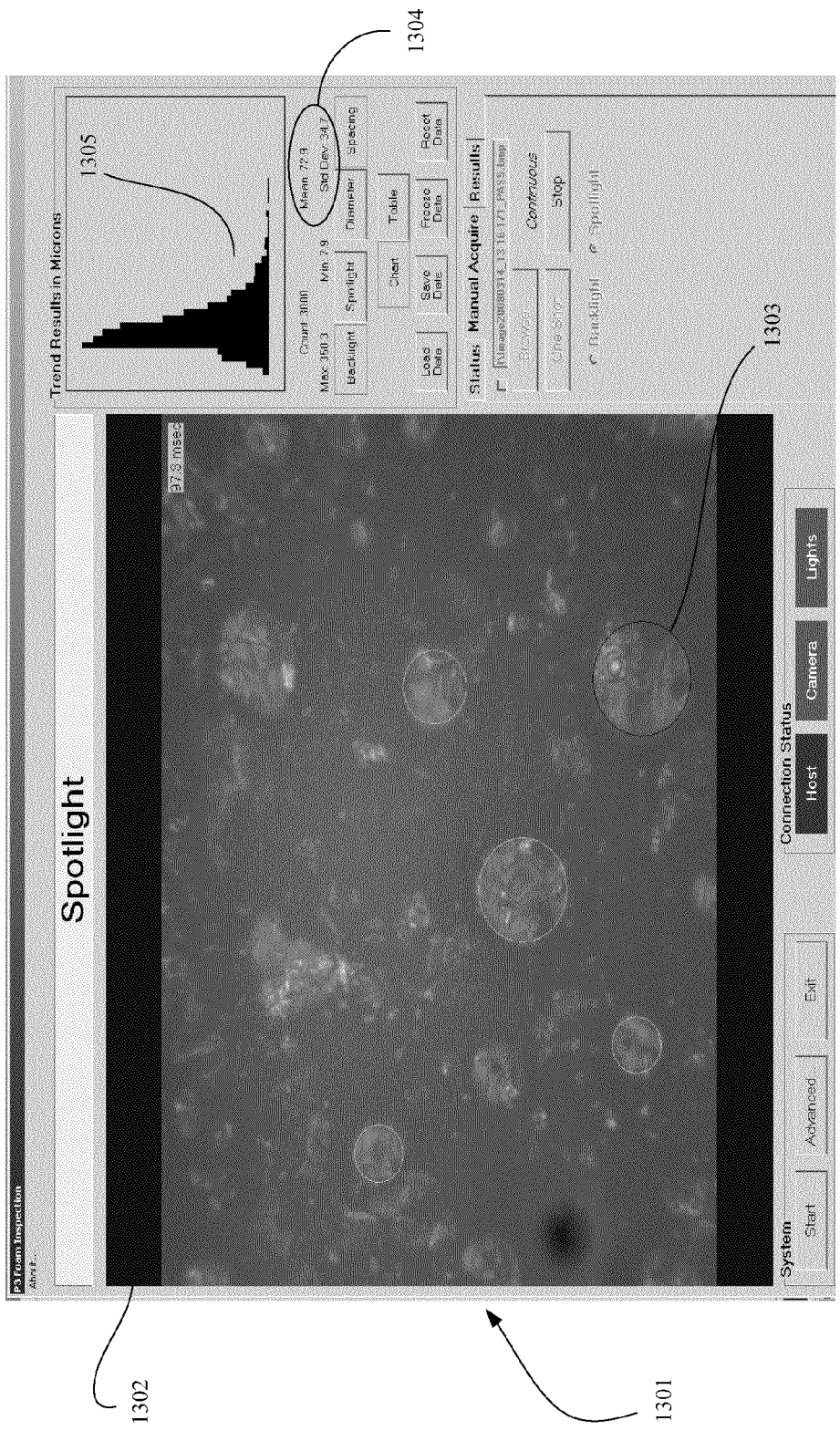
FIG. 13 is a GUI view showing the surface bubbles in a foam generated by a foam generator and related statistics, in accordance with an example embodiment.

FIG. 13 is a GUI view showing the surface bubbles in a foam generated by a foam generator and related statistics, in accordance with an example embodiment. In an example embodiment, the GUI view 1301 might be displayed on a computer peripheral such as a monitor by PC 703 in FIG. 7. The GUI view includes an image 1302 of the cleaning foam. The image 1302 includes surface bubbles such as surface bubble 1303 that are visible in the flow cell when it is lit from the top by an LED source (e.g., a spotlight). The GUI view 1301 also includes a histogram 1305 and statistics 1304 resulting from analysis of the image 1302. The statistics 1304 include a mean spacing of 72.9 microns with a standard deviation of 34.7 microns, as well as a maximum spacing of 350.3 microns and a minimum spacing of 7.9 microns. Here it will be appreciated that the button labeled "Spacing" appears relatively depressed compared to the "Diameter" button in GUI view 1301. In an example embodiment, histogram 1305 and the statistics 1304 might be generated by PC software that measures diameter or spacing of the surface bubbles such as surface bubble 1303 in image 1302. In an alternative example embodiment, other surface bubble attributes (e.g., radius, circumference, etc.) might be measured by the PC software and serve as a basis for a histogram and/or statistics to be displayed in a GUI view similar to GUI view 1301. The GUI view 1301 also includes a button which allows for manual acquisition of an image and subsequent analysis.

It will be appreciated that the PC software might persistently store an image, such as image 1202 or 1302, in a file such as a JPEG (Joint Photographic Experts Group) or bitmap file, with or without displaying the GUI views 1201 and 1301. Similarly, the PC software might persistently store the histogram and/or statistics derived from an image, such as image 1202 or 1302 in a file, e.g., a Microsoft Excel® spreadsheet file, which records the filename for the image, with or without displaying the GUI views 1201 and 1301. Subsequently, the PC software might use the stored images, histograms, and/or statistics to create other statistics, e.g., a time series, or perform other analysis, e.g., trend analysis.

In an example embodiment involving visual inspection, the PC software might display a time series of images (or histograms) as an animated slideshow in GUI views to provide decision support to a user of a wet system.

In an alternative example embodiment involving further automation, a controller (e.g., a process-moduleVME controller) might take over data acquisition once the PC software is set up and running (e.g., the controller might start and stop data acquisition, reset summary statistics buffers, acquire summary statistics, etc.). Or in another example embodiment, the PC software might report the statistics resulting from such analysis to a controller (e.g., a process-moduleVME controller as described above) that might, for example, cause an adjustment to the relative amount of gas in the P3 foam flowing through the proximity head to the interfacing meniscus.

Figure 14:
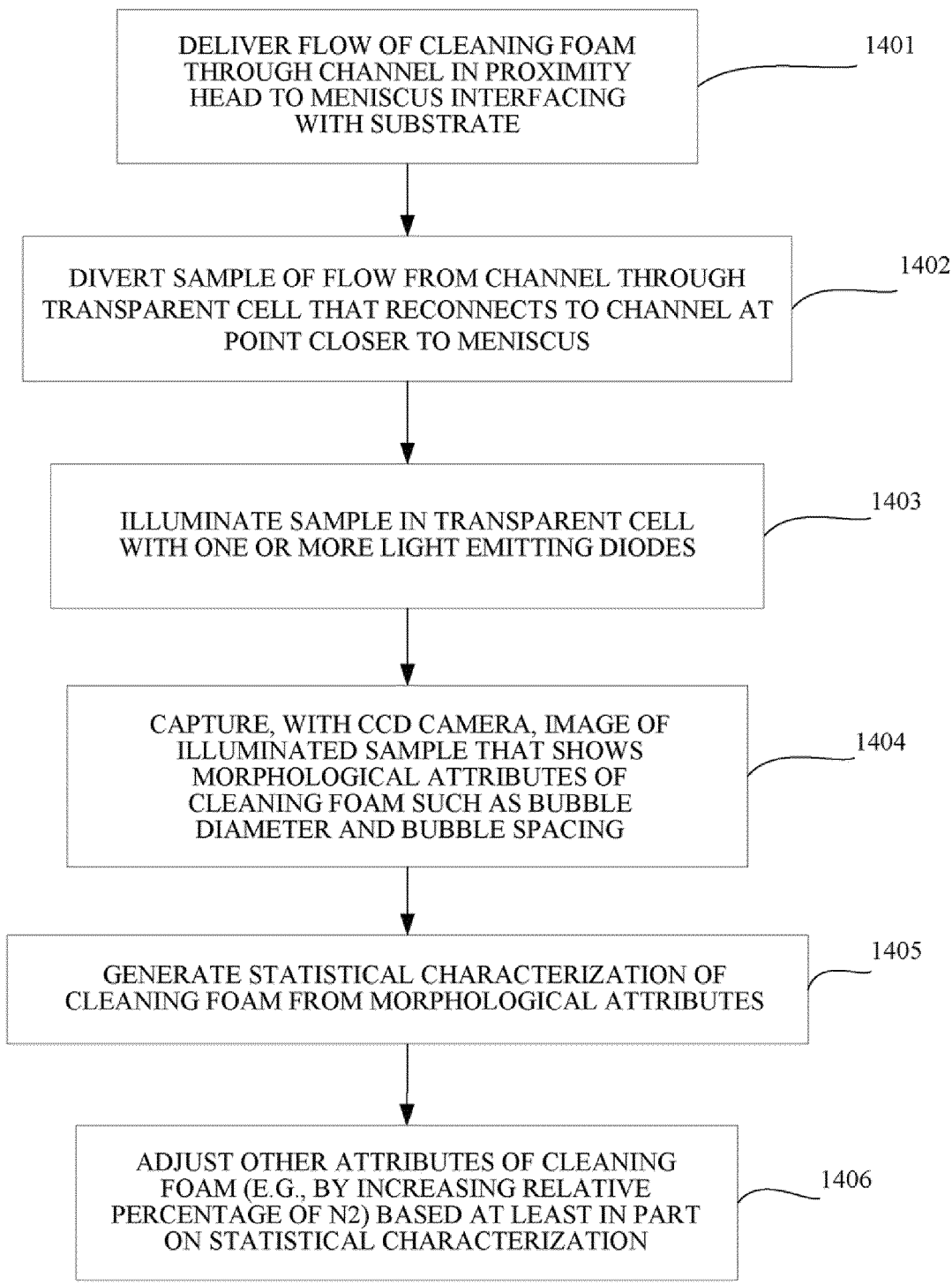
FIG. 14 is a flowchart diagram of a process for generating a morphological characterization of a cleaning foam, in accordance with an example embodiment.

FIG. 14 is a flowchart diagram of a process for generating a morphological characterization of a cleaning foam, in accordance with an example embodiment. In the first operation 1401 of the process, a wet system delivers a flow of cleaning foam (e.g., P3) through a channel in a proximity head to a meniscus interfacing with a substrate (e.g., a semiconductor wafer). In the next operation 1402, the wet system diverts a sample of the flow from the channel through a transparent cell that reconnects to the channel at point closer to the meniscus. In operation 1403, the wet system illuminates the sample in the transparent cell with one or more light emitting diodes (e.g., from the top or the back and alternating between the two if in automatic operational mode). In operation 1404, the wet system captures, with a CCD camera, an image of the illuminated sample that shows morphological attributes of the cleaning foam such as bubble diameter and bubble spacing. Then in operation 1405, the wet system generates a statistical characterization of cleaning foam from the morphological attributes. Finally, in operation 1406, the wet system adjusts other attributes of the cleaning foam (e.g., by increasing the relative percentage of N2) based at least in part on the statistical characterization. As noted above, this final operation might be automated along with the other operations in the process, in an example embodiment.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

Further, the invention may be practiced with other computer system configurations including hand-held devices, microprocessor systems, microprocessor-based or programmable consumer electronics, minicomputers, mainframe computers and the like. The invention may also be practiced in distributing computing environments where tasks are performed by remote processing devices that are linked through a network.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the foregoing example embodiments have been described in some detail for purposes of clarity of understanding, it will be apparent that certain changes and modifications may be practiced within the scope of the appended claims. Accordingly, the example embodiments are to be considered as illustrative and not restrictive, and the inventions are not to be limited to the details given here, but may be modified within the scope and equivalents of the appended claims.

What is claimed is:

1. An apparatus, comprising:
   a proximity head that includes a channel that delivers a flow of cleaning foam onto a substrate;
   a transparent cell that is connected to the channel by an input passage and an output passage, wherein the input passage diverts a sample of the flow from the channel into the transparent cell and the output passage diverts the sample from the transparent cell back into the channel;
   one or more light emitting diodes that illuminate the sample in the transparent cell; and
   an optical device that captures an image of the illuminated sample.

2. An apparatus as in claim 1, wherein the optical device includes a CCD camera.

3. An apparatus as in claim 1, wherein the optical device includes a borescope.

4. An apparatus as in claim 1, wherein the transparent cell is made of quartz.

5. An apparatus as in claim 1, wherein the illumination of the sample results from backlighting by at least one light emitting diode.

6. An apparatus as in claim 5, wherein the image of the illuminated sample shows bulk bubble diameter or bulk bubble spacing for the cleaning foam.

7. An apparatus as in claim 1, wherein the illumination of the sample results from top-lighting by at least one light emitting diode.

8. An apparatus as in claim 7, wherein the image of the illuminated sample shows surface bubble diameter or surface bubble spacing for the cleaning foam.

9. An apparatus as in claim 1, further comprising a processor and instructions encoded in a tangible medium that when executed by the processor is operable to control a capture of images by the optical device and a statistical characterization of the images.

10. An apparatus as in claim 9, wherein the encoded instructions are further operable to display any captured images and statistical characterization of the images in a graphical user interface on a peripheral device.

11. A method, comprising:
    delivering a flow of cleaning foam onto a substrate through a channel in a proximity head;
    diverting a sample of the flow from the channel through a transparent cell that is connected to the channel by an input passage that leads from the channel to the transparent cell and by an output passage that leads from the transparent cell back to the channel;
    illuminating the sample in the transparent cell with one or more light emitting diodes; and
    capturing an image of the illuminated sample with an optical device.

12. A method as in claim 11, wherein the optical device includes a CCD camera.

13. A method as in claim 11, wherein the optical device includes a borescope.

14. A method as in claim 11, wherein the transparent cell is made of quartz.

15. A method as in claim 11, wherein the illumination of the sample results from backlighting by at least one light emitting diode.

16. A method as in claim 15, wherein the image of the illuminated sample shows bulk bubble diameter or bulk bubble spacing for the cleaning foam.

17. A method as in claim 11, wherein the illumination of the sample results from top-lighting by at least one light emitting diode.

18. A method as in claim 17, wherein the image of the illuminated sample shows surface bubble diameter or surface bubble spacing for the cleaning foam.

19. A method, comprising:
    delivering a flow of cleaning foam onto a substrate though a channel in a proximity head;
    diverting a sample of the flow from the channel through a transparent cell that is connected to the channel by an input passage that leads from the channel to the transparent cell and by an output passage that leads from the transparent cell back to the channel;

illuminating the sample in the transparent cell with one or more light emitting diodes;

capturing an image of the illuminated sample with an optical device, wherein the image shows attributes of the cleaning foam including bubble diameter and bubble spacing;

generating a statistical characterization from the attributes of the cleaning foam; and adjusting other attributes of the cleaning foam based at least in part on the statistical characterization.

20. A method as in claim 19, wherein the optical device includes a CCD camera.

* * * * *